United States Patent
Yonemura et al.

(10) Patent No.: US 12,369,498 B2
(45) Date of Patent: Jul. 22, 2025

(54) MAGNETIC DOMAIN WALL MOVING ELEMENT AND MAGNETIC ARRAY

(71) Applicant: TDK CORPORATION, Tokyo (JP)

(72) Inventors: Shogo Yonemura, Tokyo (JP); Tatsuo Shibata, Tokyo (JP); Shogo Yamada, Tokyo (JP)

(73) Assignee: TDK CORPORATION, Tokyo (JP)

(*) Notice: Subject to any disclaimer, the term of this patent is extended or adjusted under 35 U.S.C. 154(b) by 550 days.

(21) Appl. No.: 17/899,131

(22) Filed: Aug. 30, 2022

(65) Prior Publication Data
US 2024/0074325 A1   Feb. 29, 2024

(51) Int. Cl.
*H10N 50/80* (2023.01)
*H10B 61/00* (2023.01)
*H10N 50/01* (2023.01)
*H10N 50/85* (2023.01)

(52) U.S. Cl.
CPC ............ *H10N 50/80* (2023.02); *H10B 61/00* (2023.02); *H10N 50/01* (2023.02); *H10N 50/85* (2023.02)

(58) Field of Classification Search
CPC ........ H10N 50/80; H10N 50/01; H10N 50/85; H10N 50/10; H10N 59/00; H10B 61/00; H10B 61/22; G11C 19/0808; G11C 2213/54
See application file for complete search history.

(56) References Cited

U.S. PATENT DOCUMENTS

| | | | |
|---|---|---|---|
| 2011/0199818 A1* | 8/2011 | Fukami | G11C 11/161 365/171 |
| 2012/0278582 A1 | 11/2012 | Fukami et al. | |
| 2021/0098690 A1* | 4/2021 | Ashida | H10N 50/10 |
| 2022/0051708 A1 | 2/2022 | Yamada et al. | |

FOREIGN PATENT DOCUMENTS

| | | |
|---|---|---|
| WO | 2011/052475 A1 | 5/2011 |
| WO | 2020/230877 A1 | 11/2020 |

* cited by examiner

*Primary Examiner* — Shih Tsun A Chou
(74) *Attorney, Agent, or Firm* — Oliff PLC (57) ABSTRACT

A magnetic domain wall moving element includes a first ferromagnetic layer, non-magnetic layer, second ferromagnetic layer, first magnetization fixed part, second magnetization fixed part, first surface layer and second surface layer. The first and second ferromagnetic layer sandwich the non-magnetic layer, the second ferromagnetic layer has a region having a magnetic domain wall formed therein, the first magnetization fixed part contacts second ferromagnetic layer, the second magnetization fixed part contacts second ferromagnetic layer at a position different from that of the first magnetization fixed part, the first is thicker than the second magnetization fixed part, the first surface layer contacts the first magnetization fixed part's first surface, the second surface layer contacts the second magnetization fixed part's first surface, and a constituent atom of a portion of the first surface layer in contact with the first magnetization fixed part are different from a constituent atom of the second surface layer.

9 Claims, 9 Drawing Sheets

MAGNETIC DOMAIN WALL MOVING ELEMENT AND MAGNETIC ARRAY

BACKGROUND

The present invention relates to a magnetic domain wall moving element and a magnetic array.

Next-generation non-volatile memories which are replacing flash memories and the like for which the limit of miniaturization has become apparent are attracting attention. For example, magnetoresistive random access memories (MRAMs), resistive random access memories (ReRAMs), phase change random access memories (PCRAMs), and the like are known as next-generation non-volatile memories.

MRAMs utilize a change in resistance value caused due to a change in direction of magnetization for data recording. Data recording is performed using magnetoresistive change elements constituting MRAMs. For example, PCT International Publication No. WO 2011/052475 describes a magnetoresistive change element (magnetic domain wall moving element) in which multi-valued data can be recorded by moving a magnetic domain wall in a first magnetization free layer (magnetic domain wall moving layer). Furthermore, PCT International Publication No. WO 2011/052475 describes that magnetization fixed parts configured to limit a movement range of a magnetic domain wall are provided at both ends of the first magnetization free layer (magnetic domain wall moving layer). The magnetization fixed parts provided at both ends have different magnetization orientation directions.

SUMMARY

The magnetization of a first magnetization fixed part and the magnetization of a second magnetization fixed part (hereinafter referred to as a "first magnetization fixed part and a second magnetization fixed part") can be oriented in different directions using a difference in coercive force between the two magnetization fixed parts. If there is a difference between the magnetic properties of the first magnetization fixed part and the magnetic properties of the second magnetization fixed part, the magnetization of each of the magnetization fixed parts is easily fixed.

The present invention was made in view of the above problems, and an object of the present invention is to provide a magnetic domain wall moving element and a magnetic array in which an orientation direction of magnetization of a magnetization fixed part is easily determined.

A magnetic domain wall moving element according to a first aspect includes: a first ferromagnetic layer; a non-magnetic layer; a second ferromagnetic layer; a first magnetization fixed part; a second magnetization fixed part; a first surface layer; and a second surface layer. The first ferromagnetic layer and the second ferromagnetic layer sandwich the non-magnetic layer. The second ferromagnetic layer has a region having a magnetic domain wall formed therein. The first magnetization fixed part is in contact with the second ferromagnetic layer. The second magnetization fixed part is in contact with the second ferromagnetic layer at a position different from that of the first magnetization fixed part. The first magnetization fixed part is thicker than the second magnetization fixed part. The first surface layer is in contact with a first surface of the first magnetization fixed part. The second surface layer is in contact with a first surface of the second magnetization fixed part. The first surface of the first magnetization fixed part is a surface of the first magnetization fixed part opposite to a surface thereof in contact with the second ferromagnetic layer. The first surface of the second magnetization fixed part is a surface of the second magnetization fixed part opposite to a surface thereof in contact with the second ferromagnetic layer. Constituent atoms of a portion of the first surface layer in contact with the first magnetization fixed part are different from constituent atoms of a portion of the second surface layer in contact with the second magnetization fixed part.

DETAILED DESCRIPTION

Embodiments will be described in detail below with appropriate reference to the drawings. In the drawings used in the following explanations, in order to make it easier to understand the features of the present invention, enlarged characteristic parts may be provided for convenience in some cases and the dimensional ratios of the constituent elements may differ from the actual ones in some cases. The materials, the dimensions, and the like exemplified in the following description are examples and the present invention is not limited to them and can be modified as appropriate within the range in which the effects of the present invention are achieved.

First, directions will be defined. An x direction and a y direction are directions substantially parallel to one surface of a substrate Sub (refer to FIG. 2) which will be described later. The x direction is a direction in which a magnetic domain wall moving layer 1 which will be described later extends. The y direction is a direction orthogonal to the x direction in an xy plane. A z direction is a direction directed from the substrate Sub which will be described later toward a magnetic domain wall moving element. Although a +z direction may represent an "upward direction" and a −z direction may represent a "downward direction" in some cases in the specification, these representations are for convenience and do not define the direction of gravity.

First Embodiment

Figure 1:
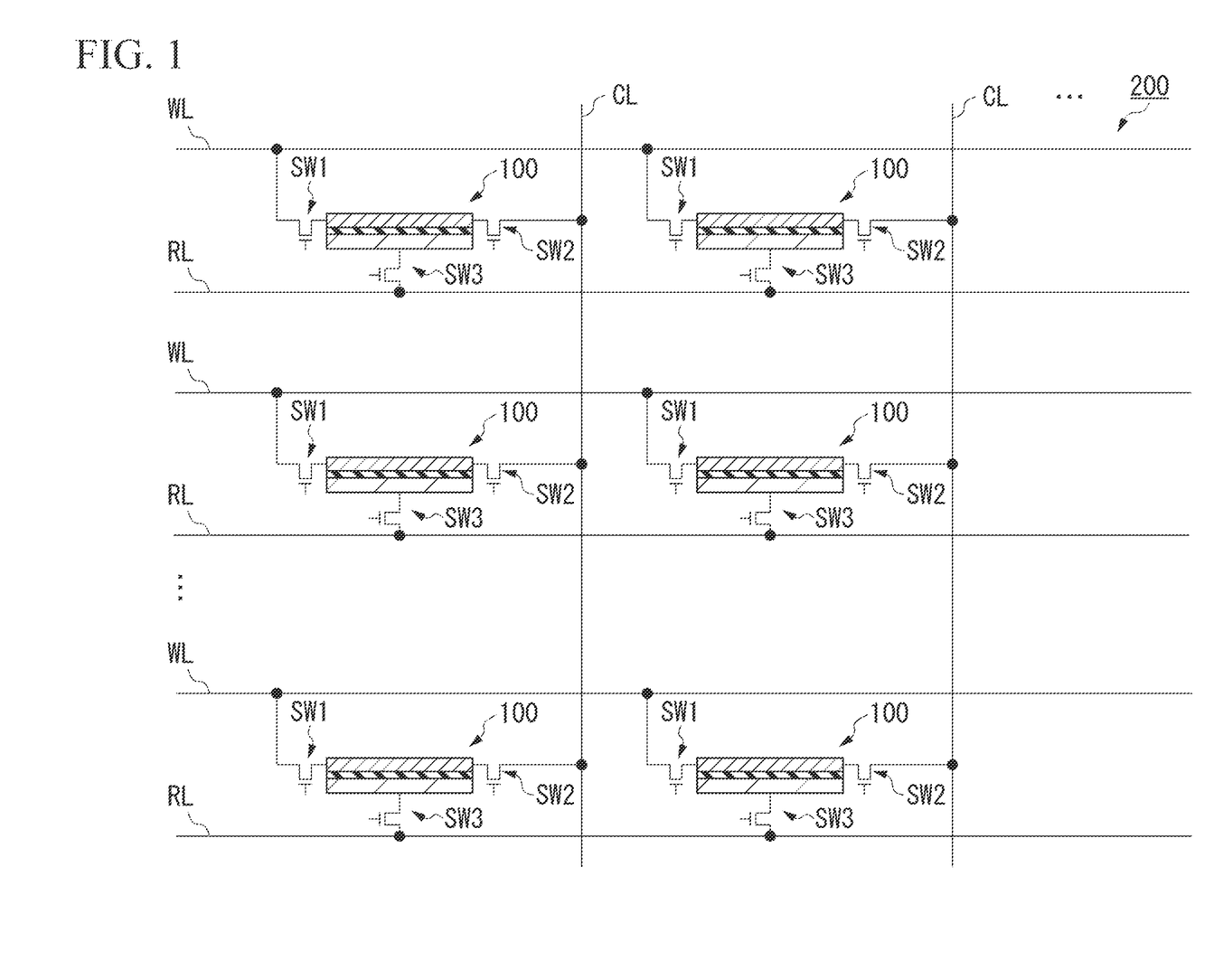
FIG. 1 is a constitution diagram of a magnetic array according to a first embodiment.

FIG. 1 is a constitution diagram of a magnetic array according to a first embodiment. A magnetic array 200 includes a plurality of magnetic domain wall moving elements 100, a plurality of first wirings WL, a plurality of second wirings CL, a plurality of third wirings RL, a plurality of first switching elements SW1, a plurality of second switching elements SW2, and a plurality of third switching elements SW3. The magnetic array 200 can be used, for example, for magnetic memories, multiply accumulate units, neuromorphic devices, spin memristors, and magneto-optical elements.

Each of the first wirings WL is a write wiring. Each of the first wirings WL electrically connects a power source and one or more of the magnetic domain wall moving elements 100. The power source is connected to one end of the magnetic array 200 when in use.

Each of the second wirings CL is a common wiring. The common wiring is a wiring which can be used both when writing data and when reading data. Each of the second wirings CL electrically connects a reference potential and one or more of the magnetic domain wall moving elements 100. The reference potential is, for example, a ground. The second wirings CL may be provided for each of the plurality of magnetic domain wall moving elements 100 or may be provided over the plurality of magnetic domain wall moving elements 100.

Each of the third wirings RL is a readout wiring. Each of the third wirings RL electrically connects the power source and one or more of the magnetic domain wall moving elements 100. The power source is connected to one end of the magnetic array 200 when in use.

In FIG. 1, each of the plurality of magnetic domain wall moving elements 100 is connected to the first switching elements SW1, the second switching elements SW2, and the third switching elements SW3. The first switching element SW1 is connected between the magnetic domain wall moving element 100 and the first wiring WL. The second switching element SW2 is connected between the magnetic domain wall moving element 100 and the second wiring CL. The third switching element SW3 is connected between the magnetic domain wall moving element 100 and the third wiring RL.

If the first switching element SW1 and the second switching element SW2 are turned on, a write current flows between a first wiring WL and a second wiring CL connected to a predetermined magnetic domain wall moving element 100. If the second switching element SW2 and the third switching element SW3 are turned on, a read current flows between a second wiring CL and a third wiring RL connected to predetermined magnetic domain wall moving elements 100.

The first switching elements SW1, the second switching elements SW2, and the third switching elements SW3 are elements configured to control a flow of a current. The first switching elements SW1, the second switching elements SW2, and the third switching elements SW3 are, for example, transistors. The first switching elements SW1, the second switching elements SW2, and the third switching elements SW3 may be elements such as ovonic threshold value switches (OTSs: ovonic threshold switches) in which a phase change of a crystal layer is used, elements such as metal-insulator transition (MIT) switches in which a change in band structure is used, elements such as Zener diodes and avalanche diodes in which a breakdown voltage is used, or elements in which conductivity changes with a change in atomic position.

Any of the first switching elements SW1, the second switching elements SW2, and the third switching elements SW3 may be shared by the magnetic domain wall moving elements 100 connected to the same wiring. For example, when sharing the first switching elements SW1, one of the first switching elements SW1 is provided upstream (one ends) of the first wirings WL. For example, when sharing the second switching elements SW2, one of the second switching elements SW2 is provided upstream (one ends) of the second wirings CL. For example, when sharing the third switching elements SW3, one of the third switching elements SW3 is provided upstream (one ends) of the third wirings RL.

Figure 2:
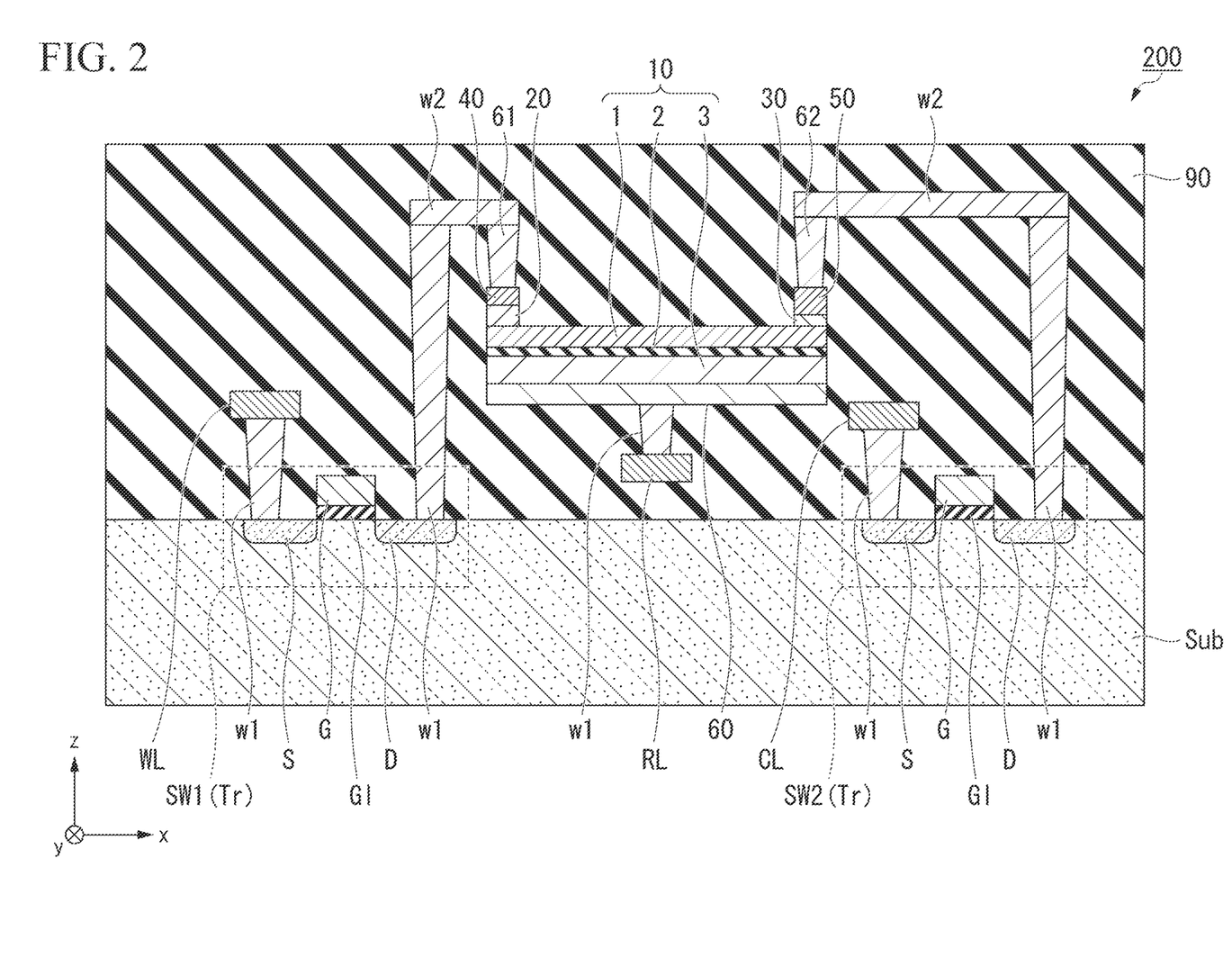
FIG. 2 is a cross-sectional view near a magnetic domain wall moving element of the magnetic array according to the first embodiment.

FIG. 2 is a cross-sectional view near the magnetic domain wall moving elements 100 of the magnetic array 200 according to the first embodiment. FIG. 2 is a cross section obtained by cutting one of the magnetic domain wall moving elements 100 in FIG. 1 along the xz plane passing through a center of a width of the magnetic domain wall moving layer 1 in the y direction.

The first switching element SW1 and the second switching element SW2 shown in FIG. 2 are transistors Tr. Each of the transistors Tr has a gate electrode G, a gate insulating film GI, and a source S and a drain D formed on the substrate Sub. The source S and the drain D are defined using a flow direction of a current and both are active regions. FIG. 2 only shows an example and a positional relationship between the source S and the drain D may be reversed. The substrate Sub is, for example, a semiconductor substrate. The third switching element SW3 is electrically connected to the third wiring RL and is, for example, deviated in the y direction in FIG. 2.

Each of the transistors Tr and the magnetic domain wall moving element 100 is electrically connected via wirings w1 and w2. The wirings w1 and w2 contain a conductive material. The wiring w1 is a via wiring extending in the z direction. The wiring w2 is an in-plane wiring extending in any direction in the xy plane. The wirings w1 and w2 are disposed inside an insulating layer 90.

The insulating layer 90 is an insulating layer formed to insulate between wirings of a multi-layer wiring and between elements. The magnetic domain wall moving elements 100 and the transistors Tr are electrically separated using the insulating layer 90 except for the wirings w1 and w2. The insulating layer 90 may be made of, for example, silicon oxide (SiOx), silicon nitride (SiNx), silicon carbide (SiC), chromium nitride, silicon carbonitride (SiCN), silicon oxynitride (SiON), aluminum oxide ($Al_2O_3$), zirconium oxide (ZrOx), magnesium oxide (MgO), and the like.

Although FIG. 2 shows an example in which the magnetic domain wall moving elements 100 are above the substrate Sub with the insulating layer 90 therebetween, the magnetic domain wall moving elements 100 may be on the substrate Sub.

The magnetic domain wall moving elements 100 are connected to, for example, three the electrodes 60, 61, and 62. The electrode 60 is connected to a reference layer 3. The electrode 61 is connected to a first magnetization fixed part 20. The electrode 62 is connected to a second magnetization fixed part 30. The electrodes 60, 61, and 62 contain a conductive material.

"Magnetic Domain Wall Moving Element"

Figure 3:
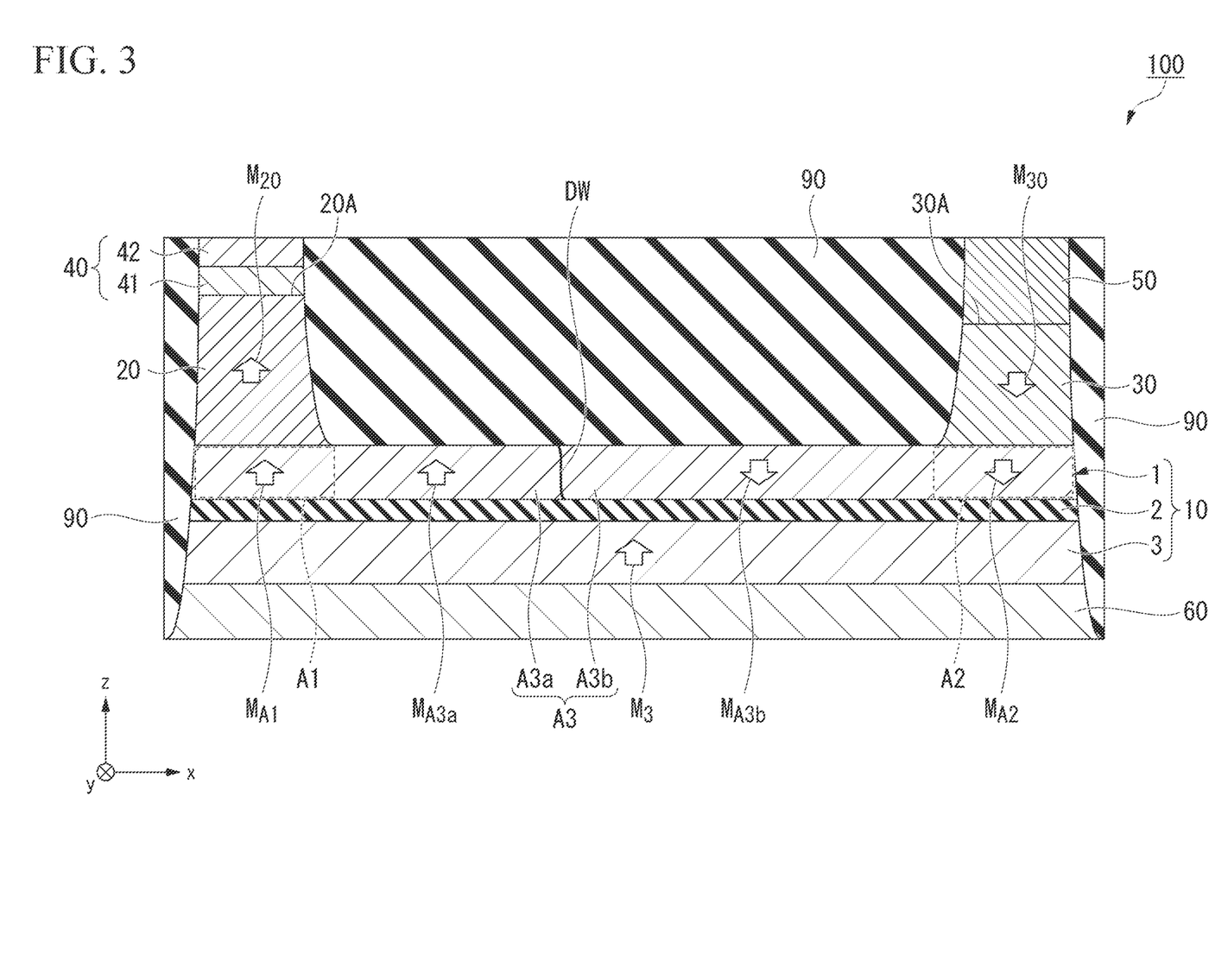
FIG. 3 is a cross-sectional view of the magnetic domain wall moving element according to the first embodiment.
Figure 4:
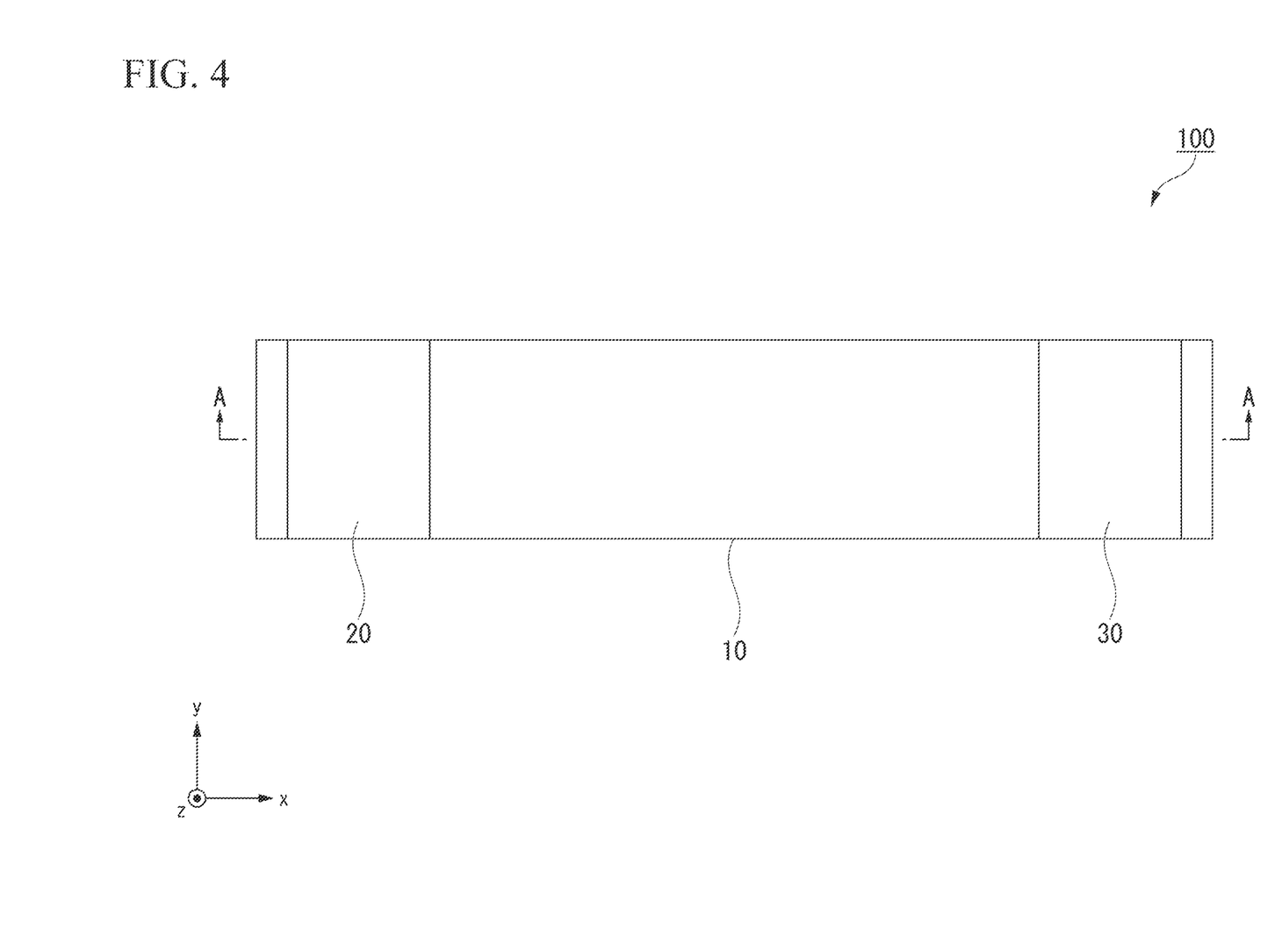
FIG. 4 is a plan view of the magnetic domain wall moving element according to the first embodiment.

FIG. 3 is a cross-sectional view of the magnetic domain wall moving element 100 cut along the xz plane passing through a center of the magnetic domain wall moving layer 1 in the y direction. FIG. 3 is a cross section taken along line A-A of FIG. 4. FIG. 4 is a plan view of the magnetic domain wall moving element 100 when viewed from the z direction. The arrow shown in FIG. 3 is an example of an orientation direction of the magnetization of a ferromagnetic material.

The magnetic domain wall moving element 100 have, for example, a magnetoresistive effect element 10, the first magnetization fixed part 20, the second magnetization fixed part 30, a first surface layer 40, and a second surface layer 50. The magnetic domain wall moving elements 100 are, for example, three-terminal type elements connected to the three electrodes 60, 61, and 62. The periphery of the magnetic domain wall moving elements 100 is covered with the insulating layer 90.

The magnetoresistive effect element 10 includes the magnetic domain wall moving layer 1, a non-magnetic layer 2, and the reference layer 3. The magnetic domain wall moving layer 1 is an example of a second ferromagnetic layer. The reference layer 3 is an example of a first ferromagnetic layer. The magnetoresistive effect element 10 includes, for example, the reference layer 3, the non-magnetic layer 2, and the magnetic domain wall moving layer 1 in this order from the substrate Sub side. When writing data to the magnetoresistive effect element 10, a write current passes along the magnetic domain wall moving layer 1. When reading data from the magnetoresistive effect element 10, a read current passes between the electrode 60 and the electrode 61 or the electrode 62 and the current is applied to the magnetoresistive effect element 10 in the z direction.

The magnetic domain wall moving layer 1 extends in the x direction. The magnetic domain wall moving layer 1 has a region in which a magnetic domain wall is formed therein. The magnetic domain wall moving layer 1 has a plurality of magnetic domains therein and has a magnetic domain wall DW at boundaries of the plurality of magnetic domains. The magnetic domain wall moving layer 1 is, for example, a layer in which information can be magnetically recorded by changing a magnetic state. The magnetic domain wall moving layer 1 may be referred to as an analog layer or a magnetic recording layer in some cases.

The magnetic domain wall moving layer 1 has a magnetization fixed region A1, a magnetization fixed region A2, and a magnetic domain wall moving region A3. The magnetization fixed region A1 is a region in which the magnetic domain wall moving layer 1 and the first magnetization fixed part 20 overlap when viewed from the z direction. The magnetization fixed region A2 is a region in which the magnetic domain wall moving layer 1 and the second magnetization fixed part 30 overlap when viewed from the z direction. The magnetic domain wall moving region A3 is a region of the magnetic domain wall moving layer 1 other than the magnetization fixed region A1 and the magnetization fixed region A2. The magnetic domain wall moving region A3 is, for example, a region located between the magnetization fixed region A1 and the magnetization fixed region A2 in the x direction.

A magnetization $M_{A1}$ of the magnetization fixed region A1 is fixed by a magnetization $M_{20}$ of the first magnetization fixed part 20. A magnetization $M_{A2}$ of the magnetization fixed region A2 is fixed by a magnetization $M_{30}$ of the second magnetization fixed part 30. Fixed magnetization means that the magnetization does not reverse during a normal operation of the magnetic domain wall moving elements 100 (an external force exceeding an assumption force is not applied). The magnetization $M_{A1}$ of the magnetization fixed region A1 and the magnetization $M_{A2}$ of the magnetization fixed region A2 have, for example, opposite orientation directions.

The magnetic domain wall moving region A3 is a region in which a direction of magnetization changes and the magnetic domain wall DW can move. The magnetic domain wall moving region A3 has a first magnetic domain A3a and a second magnetic domain A3b. Magnetization $M_{A3a}$ of the first magnetic domain A3a and magnetization $M_{A3b}$ of the second magnetic domain A3b have, for example, opposite orientation directions. A boundary between the first magnetic domain A3a and the second magnetic domain A3b is the magnetic domain wall DW. Magnetization $M_{A3a}$ of the first magnetic domain A3a is, for example, oriented in the same direction as the magnetization $M_{A1}$ of the magnetization fixed region A1. Magnetization $M_{A3b}$ of the second magnetic domain A3b is, for example, oriented in the same direction as the magnetization $M_{A2}$ of the magnetization fixed region A2. In principle, the magnetic domain wall DW moves within the magnetic domain wall moving region A3 and does not enter the magnetization fixed region A1 and the magnetization fixed region A2.

If a volume ratio between the first magnetic domain A3a and the second magnetic domain A3b in the magnetic domain wall moving region A3 changes, the magnetic domain wall DW moves. The magnetic domain wall DW moves by applying a write current in the x direction of the magnetic domain wall moving region A3. For example, if a write current (for example, current pulse) in the +x direction is applied to the magnetic domain wall moving region A3, electrons flow in the −x direction which is a direction opposite to that of the current. Thus, the magnetic domain wall DW moves in the −x direction. When the current flows from the first magnetic domain A3a toward the second magnetic domain A3b, electrons spin-polarized in the second magnetic domain A3b reverse the magnetization of the first magnetic domain A3a. The magnetic domain wall DW moves in the −x direction by reversing the magnetization of the first magnetic domain A3a.

The magnetic domain wall moving layer 1 contains a magnetic material. The magnetic domain wall moving layer 1 may be a ferromagnetic material, a ferrimagnetic material, or a combination of these and an anti-ferromagnetic material capable of changing a magnetic state thereof using a current. It is preferable that the magnetic domain wall moving layer 1 have at least one element selected from the group consisting of Co, Ni, Fe, Pt, Pd, Gd, Tb, Mn, Ge, and Ga. Examples of material used for the magnetic domain wall moving layer 1 include a laminated film of Co and Ni, a laminated film of Co and Pt, a laminated film of Co and Pd, a laminated film of CoFe and Pd, MnGa-based materials, GdCo-based materials, and TbCo-based materials. Since ferrimagnetic materials such as MnGa-based materials, GdCo-based material, and TbCo-based materials have a small saturation magnetization, which reduces a threshold current required for moving the magnetic domain wall DW. Furthermore, the laminated film of Co and Ni, the laminated film of Co and Pt, and the laminated film of Co and Pd have a large coercive force, which slows down a movement speed of the magnetic domain wall DW. Anti-ferromagnetic materials are, for example, $Mn_3X$ (X is Sn, Ge, Ga, Pt, Ir, and the like), CuMnAs, $Mn_2Au$, and the like. The same material as the reference layer 3 which will be described later can be applied to the magnetic domain wall moving layer 1.

The non-magnetic layer 2 is located between the magnetic domain wall moving layer 1 and the reference layer 3. The non-magnetic layer 2 is laminated on one surface of the reference layer 3.

The non-magnetic layer 2 is made of, for example, a non-magnetic insulator, a semiconductor, or a metal. The non-magnetic insulator is, for example, $Al_2O_3$, $SiO_2$, MgO, $MgAl_2O_4$, and materials in which a part of Al, Si, and Mg is replaced with Zn, Be, or the like. These materials have a large band gap and excellent insulating properties. When the non-magnetic layer 2 formed of a non-magnetic insulator, the non-magnetic layer 2 is a tunnel barrier layer. The non-magnetic metal may be, for example, Cu, Au, Ag, and the like. The non-magnetic semiconductor may be, for example, Si, Ge, $CuInSe_2$, $CuGaSe_2$, $Cu(In,Ga)Se_2$, and the like.

A thickness of the non-magnetic layer 2 is, for example, 20 Å or more and may be 25 Å or more. If the thickness of the non-magnetic layer 2 increases, a resistance area product (RA) of the magnetic domain wall moving element 100 increases. The resistance area product (RA) of the magnetic domain wall moving element 100 is preferably $1 \times 10^4$ $\Omega\mu m^2$ or more, and more preferably $5 \times 10^4$ $\Omega\mu m^2$ or more. The resistance area product (RA) of the magnetic domain wall moving element 100 is expressed by the product of the element resistance of one of the magnetic domain wall moving element 100 and an element cross-sectional area of the magnetic domain wall moving element 100 (an area of a cut surface obtained by cutting the non-magnetic layer 2 along the xy plane).

The non-magnetic layer 2 is located between the reference layer 3 and the magnetic domain wall moving layer 1. The reference layer 3 is, for example, on the electrode 60. The reference layer 3 may be laminated on the substrate Sub. The reference layer 3 is closer to the substrate Sub than the magnetic domain wall moving layer 1. The reference layer 3 is at a position in which the reference layer 3 and the magnetic domain wall moving layer 1 overlap in the z direction. The magnetization $M_3$ of the reference layer 3 is more difficult to reverse than the magnetizations $M_{A3a}$ and $M_{A3b}$ of the magnetic domain wall moving region A3 of the magnetic domain wall moving layer 1. The magnetization $M_3$ of the reference layer 3 does not change an orientation thereof and is fixed when an external force is applied to the extent that the magnetizations $M_{A3a}$ and $M_{A3b}$ of the magnetic domain wall moving region A3 are reversed. The reference layer 3 may be referred to as a "pinned layer" in some cases. The reference layer 3 may composed of a plurality of layers. For example, the reference layer 3 may have a plurality of ferromagnetic layers and an intermediate layer located between the plurality of ferromagnetic layers. Two ferromagnetic layers having an intermediate layer located therebetween may be magnetically joined to form a synthetic anti-ferromagnetic structure (SAF).

The reference layer 3 contains a ferromagnetic material. The reference layer 3 contains, for example, a material which facilitates achieving a coherent tunnel effect between the reference layer 3 and the magnetic domain wall moving layer 1. The reference layer 3 contains, for example, a metal selected from the group consisting of Cr, Mn, Co, Fe, and Ni, an alloy containing one or more of these metals, and an alloy containing these metals and at least one or more elements of B, C, and N, and the like. The reference layer 3 is, for example, Co—Fe, Co—Fe—B, or Ni—Fe.

The reference layer 3 may be, for example, a Heusler alloy. The Heusler alloy is a half-metal and has high spin polarizability. The Heusler alloy is an intermetallic compound having a chemical composition of XYZ or $X_2YZ$, X is a transition metal element or a noble metal element of the Co, Fe, Ni, or Cu group on the periodic table, Y is a transition metal of the Mn, V, Cr, or Ti group or an element species of X, and Z is a typical element of Groups III to V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The first magnetization fixed part 20 is in contact with the magnetic domain wall moving layer 1. The second magnetization fixed part 30 is in contact with the magnetic domain wall moving layer 1 at a different position from the first magnetization fixed part 20. The first magnetization fixed part 20 and the second magnetization fixed part 30 are, for example, in contact with a different position of an upper surface of the magnetic domain wall moving layer 1. The first magnetization fixed part 20 and the second magnetization fixed part 30 are spaced apart in the x direction. The first magnetization fixed part 20 fixes the magnetization $M_{A1}$ of the magnetization fixed region A1. The second magnetization fixed part 30 fixes the magnetization $M_{A2}$ of the magnetization fixed region A2. There is a difference in a coercive force between the first magnetization fixed part 20 and the second magnetization fixed part 30. For example, the coercive force of the first magnetization fixed part 20 may be greater than the coercive force of the second magnetization fixed part 30 or less than the coercive force of the second magnetization fixed part 30.

The first magnetization fixed part 20 is thicker than the second magnetization fixed part 30. A thickness of the first magnetization fixed part 20 is a height of a perpendicular line drawn from a first surface 20A to the magnetic domain wall moving layer 1. The first surface 20A is a surface of the first magnetization fixed part 20 opposite to a surface thereof in contact with the magnetic domain wall moving layer 1 and is an upper surface of a ferromagnetic layer at an uppermost portion of the first magnetization fixed part 20 protruding from the magnetic domain wall moving layer 1. A thickness of the second magnetization fixed part 30 is a height of a perpendicular line drawn from a first surface 30A to the magnetic domain wall moving layer 1. The first surface 30A is a surface of the second magnetization fixed part 30 opposite to a surface thereof in contact with the magnetic domain wall moving layer 1 and is an upper surface of a ferromagnetic layer at an uppermost portion of the second magnetization fixed part 30 protruding from the magnetic domain wall moving layer 1.

The first surface 20A of the first magnetization fixed part 20 and the first surface 30A of the second magnetization fixed part 30 have different positions in the z direction. A surface roughness of the first surface 30A of the second magnetization fixed part 30 is, for example, greater than a surface roughness of the first surface 20A of the first magnetization fixed part 20. The surface roughnesses are, for example, an arithmetic surface roughness Ra.

Materials constituting the first magnetization fixed part 20 and the second magnetization fixed part 30 are similar to that of the reference layer 3 described above or the magnetic domain wall moving layer 1 described above. The first magnetization fixed part 20 and the second magnetization fixed part 30 may be multi-layer films.

The second magnetization fixed part 30 may have an atom (hereinafter referred to as a "first atom") other than a main constituent atom of the second magnetization fixed part 30 and an atom constituting the second surface layer 50 which will be described later. A main constituent atom of the second magnetization fixed part 30 is an element constituting a crystal structure of the second magnetization fixed part 30 when the second magnetization fixed part 30 is formed of a single layer. The main constituent atom of the second magnetization fixed part 30 is an element constituting a crystal structure of a ferromagnetic layer of the uppermost layer when the second magnetization fixed part 30 is formed of a multi-layer. A first atom can weaken the coercive force of the second magnetization fixed part 30 and increase a difference in coercive force between the first magnetization fixed part 20 and the second magnetization fixed part 30.

The first surface layer 40 is in contact with the first surface 20A of the first magnetization fixed part 20. The first surface layer 40 is in contact with a ferromagnetic layer at the uppermost portion of the first magnetization fixed part 20 protruding from the magnetic domain wall moving layer 1.

The first surface layer 40 is a non-magnetic layer. Although FIG. 3 illustrates a case in which the first surface layer 40 has two layers, the first surface layer 40 may have a single layer or three or more layers. The first surface layer 40 has, for example, a first layer 41 and a second layer 42. The first layer 41 is closer to the first magnetization fixed part 20 than the second layer 42.

The first layer 41 is a non-magnetic layer. The first layer 41 contains, for example, one or more atoms selected from the group consisting of Mg, Al, Ti, Cr, Zn, Zr, Ta, and Ru. The first layer 41 contains, for example, Mg, Al, Cr, Ta, Ti, W, Zn, Zr, Ru, Cu, Mo, Au, Pt, or Pd.

The second layer 42 is a non-magnetic layer. The second layer 42 contains, for example, Mg, Al, Cr, Ta, Ti, W, Zn, Zr, Ru, Cu, Mo, Au, Pt, or Pd.

A sputtering yield of an atom constituting the first layer 41 is, for example, lower than a sputtering yield of an atom constituting the second layer 42. For example, when the first layer 41 contains Ta and the second layer 42 contains Pt, the constitution is satisfied.

A sputtering yield is a statistical probability value of the number of atoms ejected from a target when one ion collides with the target. A sputtering yield can be calculated from the number of atoms sputtered from the target and the number of ions incident on the target and is a value uniquely determined for each target material. A lower sputtering yield means that fewer atoms are ejected from a target.

If a sputtering yield of the atom constituting the first layer 41 is low, when the film of the first layer 41 is formed, an atom constituting the first layer 41 can be prevented from mixing with the first magnetization fixed part 20. An atom mixed into the first magnetization fixed part 20 can cause a coercive force of the first magnetization fixed part 20 to decrease.

A thickness of the first layer 41 is, for example, 20 Å or more. If a thickness of the first layer 41 is sufficiently thick, when a film of a layer above the first layer 41 is formed, these film formation atoms can be prevented from entering the first magnetization fixed part 20. Furthermore, although the details will be described later, the first layer 41 can be used as an etching detection layer. In addition, if the thickness of the first layer 41 is sufficiently thick, a sufficient signal intensity can be ensured during etching.

The second surface layer 50 is in contact with the first surface 30A of the second magnetization fixed part 30. The second surface layer 50 is in contact with a ferromagnetic layer at the uppermost portion of the second magnetization fixed part 30 protruding from the magnetic domain wall moving layer 1.

The second surface layer 50 is a non-magnetic layer. Although FIG. 3 illustrates a case in which the second surface layer 50 has a single layer, the second surface layer 50 may have a laminated film of two or more layers.

The second surface layer 50 is a non-magnetic layer. The second surface layer 50 contains, for example, Mg, Al, Cr, Ta, Ti, W, Zn, Zr, Ru, Cu, Mo, Au, Pt, or Pd.

A constituent atom of a portion of the second surface layer 50 in contact with the second magnetization fixed part 30 are different from a constituent atom of a portion of the first surface layer 40 in contact with the first magnetization fixed part 20. The portion of the second surface layer 50 in contact with the second magnetization fixed part 30 is a layer which is the lowest layer when the second magnetization fixed part 30 is formed of a plurality of layers. The portion of the first surface layer 40 in contact with the first magnetization fixed part 20 is a layer which is the lowest layer and is, for example, the first layer 41 when the first magnetization fixed part 20 is formed of a plurality of layers.

Interfacial magnetic anisotropy is magnetic anisotropy occurring in a ferromagnetic layer under an influence of an interface between the ferromagnetic layer and other layers. The first surface layer 40 has an influence on the magnetic anisotropy of the magnetization of the first magnetization fixed part 20. The second surface layer 50 has an influence on the magnetic anisotropy of the magnetization of the second magnetization fixed part 30. If the constituent atom of the first surface layer 40 and the second surface layer 50 differ, a difference can be produced between the magnetic properties of the first magnetization fixed part 20 and the magnetic properties of the second magnetization fixed part 30.

A sputtering yield of a constituent atom of the portion of the first surface layer 40 in contact with the first magnetization fixed part 20 is, for example, lower than a sputtering yield of a constituent atom of the portion of the second surface layer 50 in contact with the second magnetization fixed part 30. For example, a sputtering yield of a constituent atom constituting the first layer 41 is lower than a sputtering yield of a constituent atom constituting the second surface layer 50. For example, when the first layer 41 contains Ta and the second surface layer 50 contains Pt, the constitution is satisfied.

A magnetization orientation of each layer of the magnetic domain wall moving element 100 can be confirmed, for example, by measuring a magnetization curve. The magnetization curve can be measured using, for example, a magneto optical Kerr effect (MOKE). Measurement using the MOKE is a measurement method performed by causing linearly polarized light to be incident on an object to be measured and using a magneto-optical effect (magnetic Kerr effect) in which a polarization direction is rotated.

A method of producing the magnetic domain wall moving element 100 will be described below. FIGS. 5 to 8 are diagrams for explaining the method of producing the magnetic domain wall moving element 100 according to the first embodiment.

Figure 5:
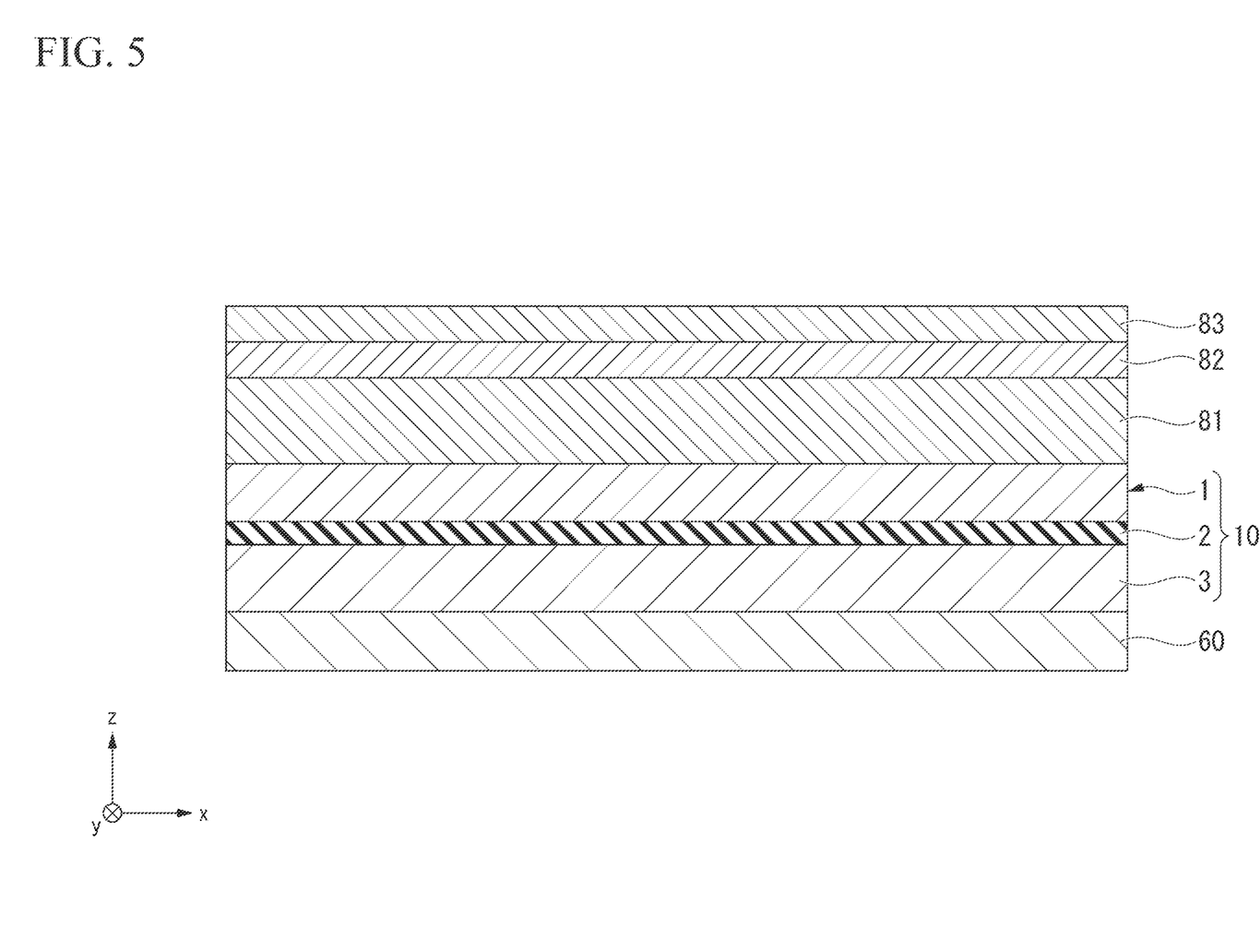
FIG. 5 is a diagram for explaining a method of producing the magnetic domain wall moving element according to the first embodiment.

First, as shown in FIG. 5, the reference layer 3, the non-magnetic layer 2, the magnetic domain wall moving layer 1, a ferromagnetic layer 81, the non-magnetic layer 82, and the non-magnetic layer 83 are laminated in this order on the electrode 60. A sputtering method, a chemical vapor deposition (CVD) method, an electron beam vapor deposition method (EB vapor deposition method), an atomic laser deposition method, or the like can be used for laminating each of the layers. When a film of the non-magnetic layer 82 is formed, a part of the atom constituting the non-magnetic layer 82 (first surface layer 40) may be mixed into the first magnetization fixed part 20.

Figure 6:
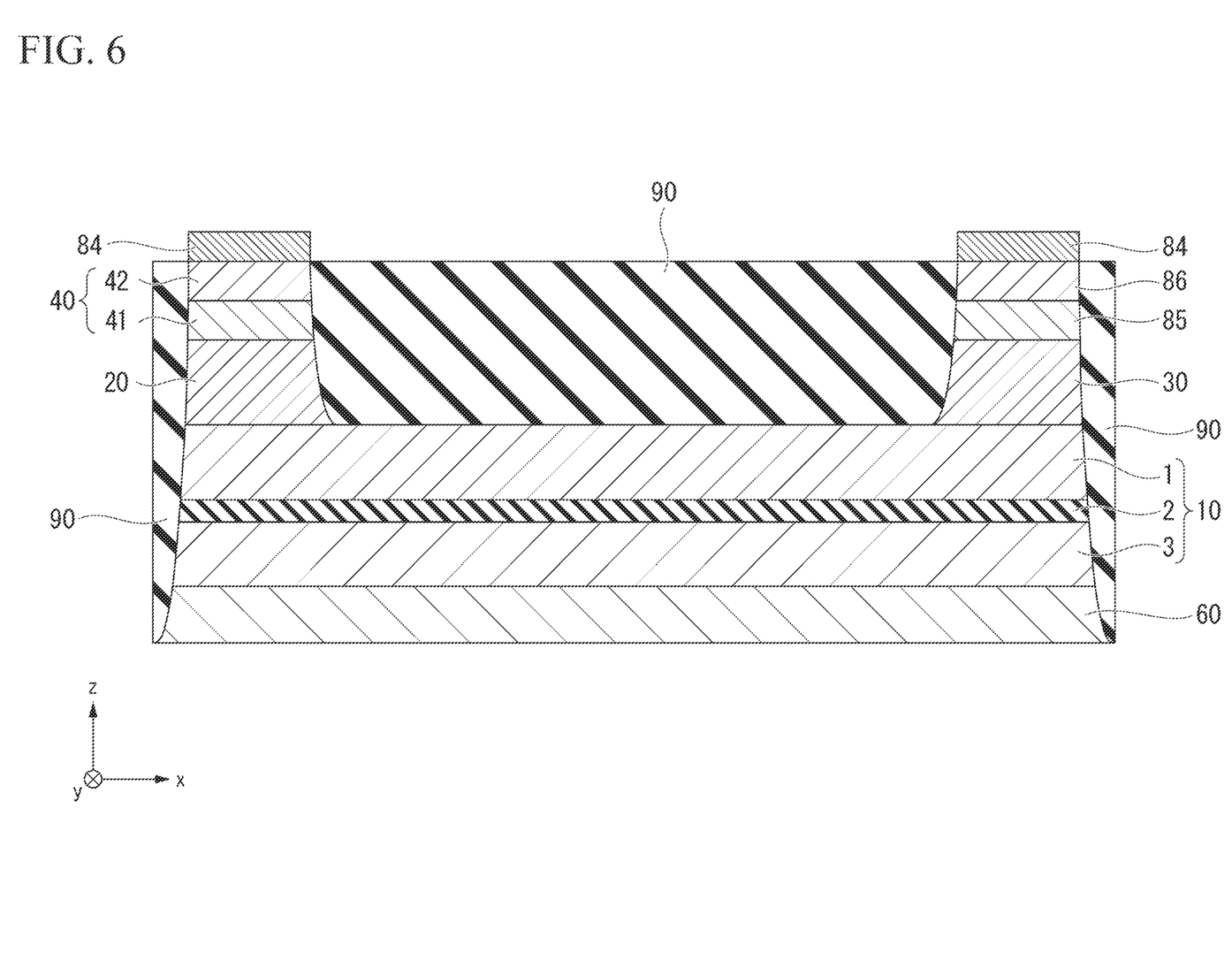
FIG. 6 is a diagram for explaining the method of producing the magnetic domain wall moving element according to the first embodiment.

Subsequently, as shown in FIG. 6, a protective film 84 is formed on an upper surface of a laminate. The protective film 84 is, for example, a resist film. Furthermore, a part of the laminate composed of the ferromagnetic layer 81, the non-magnetic layer 82, and the non-magnetic layer 83 is removed up to the magnetic domain wall moving layer 1. Furthermore, at the same time, a part of the laminate is removed up to the electrode 60 on the outside of the element. Processing can be performed using photolithography, etching (for example, Ar etching), and the like.

The ferromagnetic layer 81 becomes the first magnetization fixed part 20 and the second magnetization fixed part 30 separated from each other on the magnetic domain wall moving layer 1. The non-magnetic layer 82 becomes the first layer 41 and the non-magnetic layer 85. The non-magnetic layer 83 becomes the second layer 42 and the non-magnetic layer 86. The first layer 41 and the second layer 42 correspond to the first surface layer 40 covering a surface of the first magnetization fixed part 20. Subsequently, a removed portion of the laminate is covered with the insulating layer 90.

Figure 7:
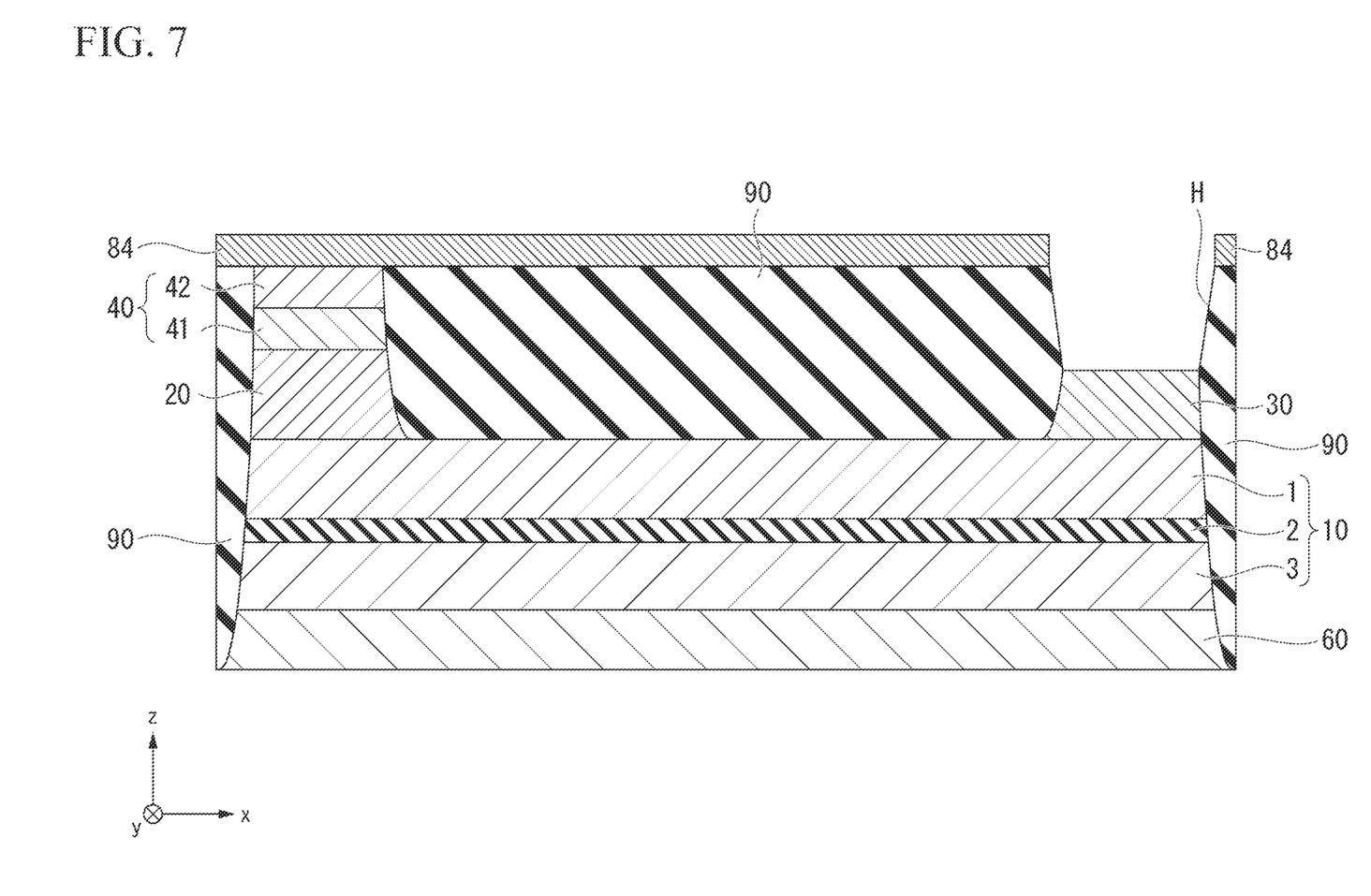
FIG. 7 is a diagram for explaining the method of producing the magnetic domain wall moving element according to the first embodiment.

Subsequently, as shown in FIG. 7, the protective film 84 is formed on the insulating layer 90 except for a portion of the non-magnetic layer 86 in which the non-magnetic layer 86 and the insulating layer 90 overlap in the z direction. Furthermore, if etching is performed on the laminate, the non-magnetic layer 86 and the non-magnetic layer 85 are removed to form an opening H through which the second magnetization fixed part 30 is exposed. Etching reaching the second magnetization fixed part 30 can be confirmed through elemental analysis while etching. Elemental analysis is performed, for example, using secondary ion mass spectroscopy (SIMS) or solid-state optical emission spectroscopy (OES). For example, the second magnetization fixed part 30 can be exposed by stopping the etching after the elapse of a certain time after the atom constituting the non-magnetic layer 85 is detected.

When etching the non-magnetic layer 85, in the second magnetization fixed part 30, an atom (first atom) other than an atom constituting the second magnetization fixed part 30 and an atom constituting the second surface layer 50 may be mixed into the second magnetization fixed part 30.

Figure 8:
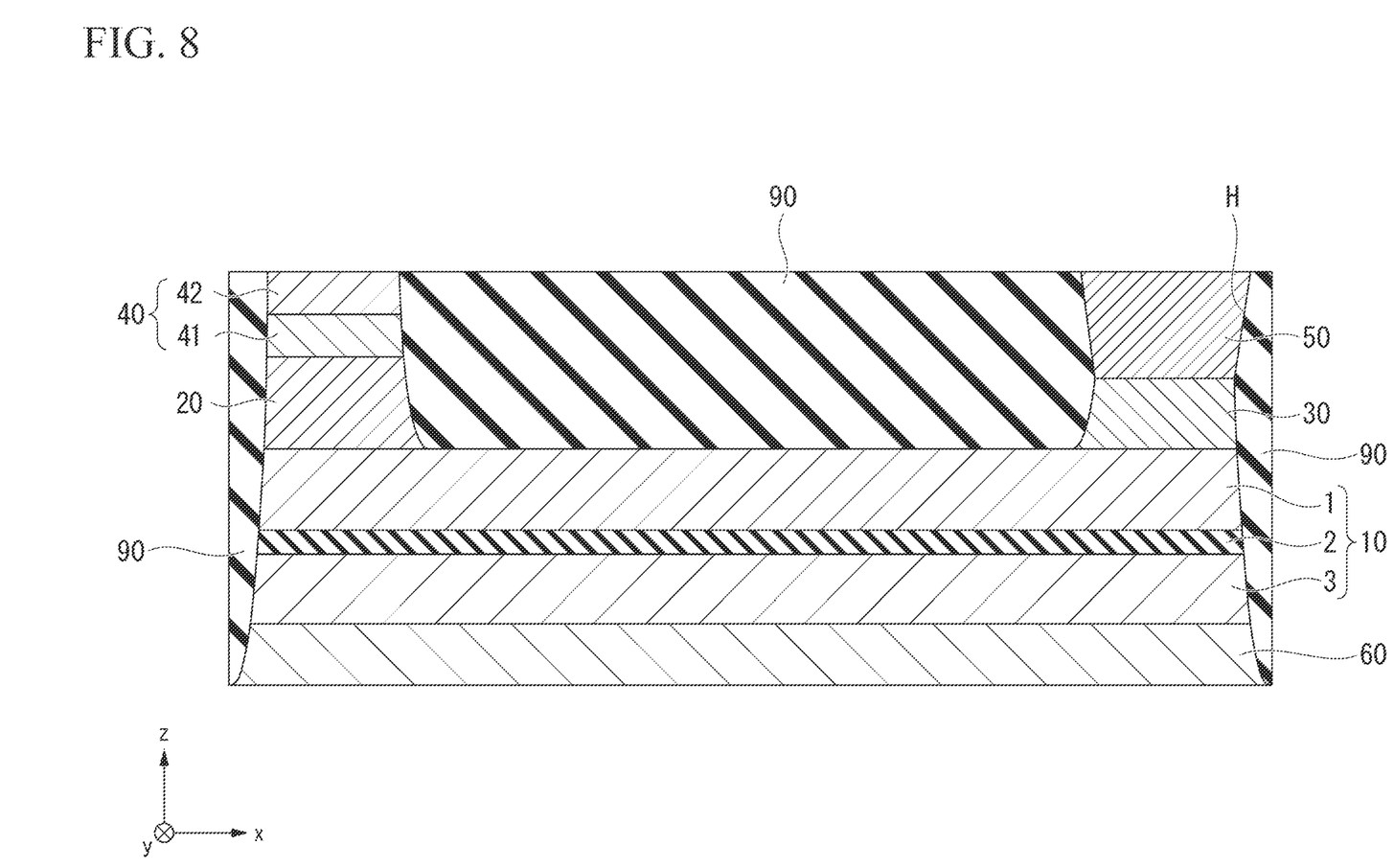
FIG. 8 is a diagram for explaining the method of producing the magnetic domain wall moving element according to the first embodiment.

Subsequently, as shown in FIG. 8, the second surface layer 50 is formed by filling the opening H with a non-magnetic material. When forming the second surface layer 50, some of the atom constituting the second surface layer 50 may be mixed into the second magnetization fixed part 30.

Subsequently, a magnetization fixing step is performed on the prepared magnetic domain wall moving elements 100. First, an external magnetic field is applied to the magnetic domain wall moving elements 100 in one direction (for example, a +z direction). The magnetization of each of the layers is oriented in a direction in which the external magnetic field is applied (for example, the +z direction).

Subsequently, an external magnetic field is applied to the magnetic domain wall moving elements 100 in a direction opposite to the previously applied external magnetic field. The external magnetic field is smaller than the previously applied external magnetic field. The external magnetic field is, for example, gradually increased from a sufficiently low magnitude. When the external magnetic field is applied, the second magnetization fixed part 30 having a small coercive force is first inverted. Since the first magnetization fixed part 20 has a certain volume and a coercive force of a predetermined value or more, the magnetization M 20 is not inverted. If the magnetization $M_{20}$ of the first magnetization fixed part 20 is inverted, the magnetization $M_{A2}$ of the magnetization fixed region A2 is also inverted.

Through the above procedure, the magnetic domain wall moving elements 100 shown in FIG. 3 are prepared. Here, although an example in which the insulating layer 90 is formed and then the non-magnetic layer 85 and the non-magnetic layer 86 are removed is shown, this order may be reversed.

In the magnetic domain wall moving elements 100 according to the first embodiment, film thicknesses of the first magnetization fixed part 20 and the second magnetization fixed part 30 differ. Furthermore, in the magnetic domain wall moving elements 100 according to the first embodiment, the first surface layer 40 in contact with the first magnetization fixed part 20 and the second surface layer 50 in contact with the second magnetization fixed part 30 are made of different materials. The magnetic properties of the first magnetization fixed part 20 and the second magnetization fixed part 30 are affected by a volume difference between the first magnetization fixed part 20 and the second magnetization fixed part 30 and a difference in strength of the interfacial magnetic anisotropy and differ. If the magnetic properties of the first magnetization fixed part 20 and the magnetic properties of the second magnetization fixed part 30 differ, the magnetization of the first magnetization fixed part 20 and the magnetization of the second magnetization fixed part 30 are easily oriented in different directions. Furthermore, if there is a difference between the magnetic properties of the first magnetization fixed part 20 and the magnetic properties of the second magnetization fixed part 30, each of the magnetizations is stabilized in a state of being oriented in a predetermined direction and thus it is possible to prevent the occurrence of variations in a magnetization direction among the plurality of magnetic domain wall moving elements 100.

Second Embodiment

Figure 9:
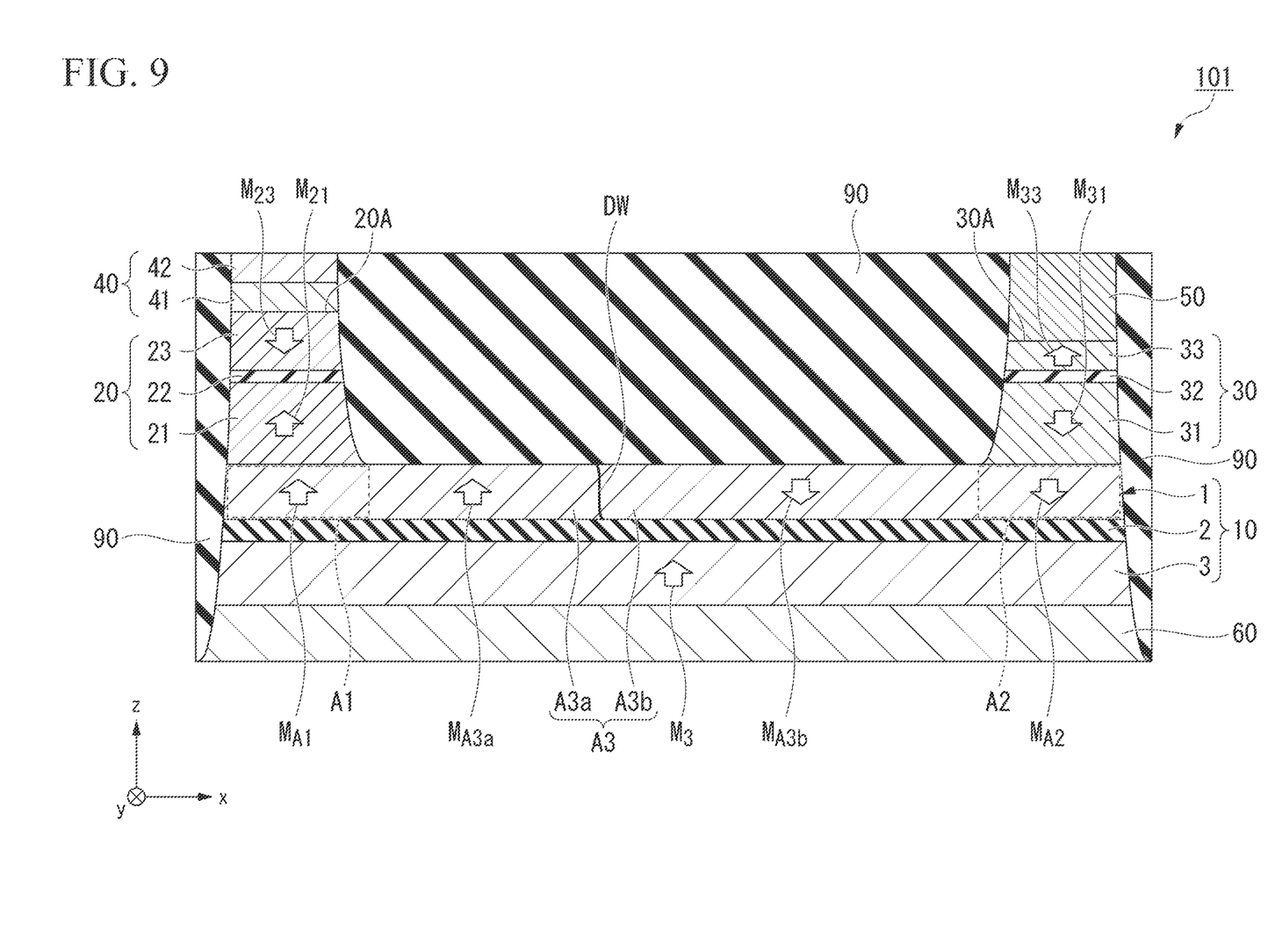
FIG. 9 is a cross-sectional view of a magnetic domain wall moving element according to a second embodiment.

FIG. 9 is a cross-sectional view of a magnetic domain wall moving element 101 according to a second embodiment cut along an xz plane passing through a center of a magnetic domain wall moving layer 1 in a y direction. The magnetic domain wall moving element 101 according to the second embodiment has constitutions of a first magnetization fixed part 20 and a second magnetization fixed part 30 different from those of the first embodiment. In the second embodiment, constituent elements that are the same as those of the first embodiment will be denoted by the same reference numerals and description thereof will be omitted.

The first magnetization fixed part 20 shown in FIG. 9 has, for example, a ferromagnetic layer 21, an intermediate layer 22, a ferromagnetic layer 23. The intermediate layer 22 is located between the ferromagnetic layer 21 and the ferromagnetic layer 23. The first magnetization fixed part 20 shown in FIG. 9 has an SAF structure in which two ferromagnetic layers and an intermediate layer located between the two ferromagnetic layers are provided.

FIG. 9 shows an example in which magnetization $M_{21}$ of the ferromagnetic layer 21 and magnetization $M_{23}$ of the ferromagnetic layer 23 are anti-ferromagnetically coupled and the magnetizations may be ferromagnetically coupled. The anti-ferromagnetic coupling and the ferromagnetic coupling may be magnetostatic coupling. The magnetization $M_{21}$ of the ferromagnetic layer 21 is oriented in the same direction as the magnetization $M_{A1}$ of the magnetization fixed region A1 of the magnetic domain wall moving layer 1.

The second magnetization fixed part 30 shown in FIG. 9 has, for example, a ferromagnetic layer 31, an intermediate layer 32, and the ferromagnetic layer 33. The intermediate layer 32 is located between the ferromagnetic layer 31 and the ferromagnetic layer 33. The second magnetization fixed part 30 shown in FIG. 9 has an SAF structure in which two ferromagnetic layers and an intermediate layer located between the two ferromagnetic layers are provided. FIG. 9 shows an example in which magnetization $M_{31}$ of the ferromagnetic layer 31 and magnetization $M_{33}$ of the ferromagnetic layer 33 are anti-ferromagnetically coupled and the magnetizations may be ferromagnetically coupled. The anti-ferromagnetic coupling and the ferromagnetic coupling may be magnetostatic coupling. The magnetization $M_{31}$ of the ferromagnetic layer 31 is oriented in the same direction as the magnetization $M_{A2}$ of the magnetization fixed region A2 of the magnetic domain wall moving layer 1.

A coercive force of the first magnetization fixed part 20 is, for example, smaller than a coercive force of the second magnetization fixed part 30. When the ferromagnetic layer 21 and the ferromagnetic layer 23 are ferromagnetically coupled, the coercive force of the first magnetization fixed part 20 is a sum of the coercive force of the ferromagnetic layer 21 and the coercive force of the ferromagnetic layer 23. When the ferromagnetic layer 21 and the ferromagnetic layer 23 are anti-ferromagnetically coupled, the coercive force of the first magnetization fixed part 20 is a difference between the coercive force of the ferromagnetic layer 21 and the coercive force of the ferromagnetic layer 23. When the ferromagnetic layer 31 and the ferromagnetic layer 33 are ferromagnetically coupled, the coercive force of the second magnetization fixed part 30 is a sum of the coercive force of the ferromagnetic layer 31 and the coercive force of the ferromagnetic layer 33. When the ferromagnetic layer 31 and the ferromagnetic layer 33 are anti-ferromagnetically coupled, the coercive force of the second magnetization fixed part 30 is a difference between the coercive force of the ferromagnetic layer 31 and the coercive force of the ferromagnetic layer 33.

Materials constituting the ferromagnetic layer 21, the ferromagnetic layer 23, the ferromagnetic layer 31, and the ferromagnetic layer 33 are the same as those of the above-described reference layer 3 or the above-described magnetic domain wall moving layer 1. These ferromagnetic layers may be formed of multi-layer films. The ferromagnetic layer 33 may have an atom other than the main constituent atom of the ferromagnetic layer 33 and the atom constituting the second surface layer 50 (hereinafter referred to as a "first atom").

The intermediate layer 22 and the intermediate layer 32 are each non-magnetic materials. Materials constituting the intermediate layer 22 and the intermediate layer 32 are, for example, similar to those of the non-magnetic layer 2 described above. The intermediate layer 22 contains, for example, one selected from the group consisting of MgO, Mg—Al—O, Mg, W, Mo, Ta, Pd, Pt, Ir, and Ru.

Thicknesses of the intermediate layer 22 and the intermediate layer 32 are, for example, 3 Å or more. Thicknesses of the intermediate layer 22 and the intermediate layer 32 are, for example, 20 Å or less.

The magnetic domain wall moving element 101 according to the second embodiment has the same effect as the magnetic domain wall moving elements 100 according to the first embodiment.

Although the preferred embodiments of the present invention have been described in detail above, the present invention is not limited to these embodiments. For example, the characteristic configurations of the respective embodiments may be combined, or part of them may be changed without changing the gist of the invention.

EXPLANATION OF REFERENCES

1 Magnetic domain wall moving layer (second ferromagnetic layer)
2 Non-magnetic layer
3 Reference layer (first ferromagnetic layer)
10 Magnetoresistive effect element
20 First magnetization fixed part
20A, 30A First surface
30 Second magnetization fixed part
40 First surface layer
41 First layer
42 Second layer
50 Second surface layer
100, 101 Magnetic domain wall moving element
200 Magnetic array

What is claimed is:

1. A magnetic domain wall moving element, comprising:
a first ferromagnetic layer;
a non-magnetic layer;
a second ferromagnetic layer;
a first magnetization fixed part;
a second magnetization fixed part;
a first surface layer; and
a second surface layer,
wherein the first ferromagnetic layer and the second ferromagnetic layer sandwich the non-magnetic layer,
the second ferromagnetic layer has a region having a magnetic domain wall formed therein,
the first magnetization fixed part is in contact with the second ferromagnetic layer,
the second magnetization fixed part is in contact with the second ferromagnetic layer at a position different from that of the first magnetization fixed part,
the first magnetization fixed part is thicker than the second magnetization fixed part,
the first surface layer is in contact with a first surface of the first magnetization fixed part,
the second surface layer is in contact with a first surface of the second magnetization fixed part,
the first surface of the first magnetization fixed part is a surface of the first magnetization fixed part opposite to a surface thereof in contact with the second ferromagnetic layer,
the first surface of the second magnetization fixed part is a surface of the second magnetization fixed part opposite to a surface thereof in contact with the second ferromagnetic layer, and
a constituent atom of a portion of the first surface layer in contact with the first magnetization fixed part are different from a constituent atom of a portion of the second surface layer in contact with the second magnetization fixed part.

2. The magnetic domain wall moving element according to claim 1, wherein a surface roughness of the first surface of the second magnetization fixed part is greater than a surface roughness of the first surface of the first magnetization fixed part.

3. The magnetic domain wall moving element according to claim 1, wherein the first surface layer has a first layer and a second layer, and
the first layer is closer to the first magnetization fixed part than the second layer.

4. The magnetic domain wall moving element according to claim 3, wherein a sputtering yield of atoms constituting the first layer is lower than a sputtering yield of atoms constituting the second layer.

5. The magnetic domain wall moving element according to claim 3, wherein the first layer contains one or more atoms selected from the group consisting of Mg, Al, Ti, Cr, Zn, Zr, Ta, and Ru.

6. The magnetic domain wall moving element according to claim 3, wherein a thickness of the first layer is 20 Å or more.

7. The magnetic domain wall moving element according to claim 1, wherein a sputtering yield of a constituent atom of a portion of the first surface layer in contact with the first magnetization fixed part is lower than a sputtering yield of a constituent atom of a portion of the second surface layer in contact with the second magnetization fixed part.

8. The magnetic domain wall moving element according to claim 1, wherein the second magnetization fixed part contains a first atom, and
   the first atom is an atom other than a main constituent atoms of the second magnetization fixed part and an atom constituting the second surface layer.

9. A magnetic array, comprising:
   a plurality of magnetic domain wall moving elements,
   wherein at least one of the plurality of magnetic domain wall moving elements is the magnetic domain wall moving element according to claim 1.

\* \* \* \* \*